US009238753B2

(12) United States Patent
Reiss et al.

(10) Patent No.: US 9,238,753 B2
(45) Date of Patent: Jan. 19, 2016

(54) CMP COMPOSITIONS SELECTIVE FOR OXIDE AND NITRIDE WITH HIGH REMOVAL RATE AND LOW DEFECTIVITY

(71) Applicant: Cabot Microelectronics Corporation, Aurora, IL (US)

(72) Inventors: Brian Reiss, Woodridge, IL (US); Glenn Whitener, Batavia, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 24 days.

(21) Appl. No.: 13/799,920

(22) Filed: Mar. 13, 2013

(65) Prior Publication Data

US 2013/0244433 A1    Sep. 19, 2013

Related U.S. Application Data

(60) Provisional application No. 61/610,843, filed on Mar. 14, 2012.

(51) Int. Cl.

| H01L 21/302 | (2006.01) |
| C09G 1/02 | (2006.01) |
| H01L 21/306 | (2006.01) |
| H01L 21/3105 | (2006.01) |
| H01L 21/321 | (2006.01) |

(52) U.S. Cl.
CPC ............ *C09G 1/02* (2013.01); *H01L 21/30625* (2013.01); *H01L 21/31053* (2013.01); *H01L 21/3212* (2013.01)

(58) Field of Classification Search
None
See application file for complete search history.

(56) References Cited

U.S. PATENT DOCUMENTS

| 3,257,342 | A | * | 6/1966 | Kwong | .......................... | 528/405 |
|---|---|---|---|---|---|---|
| 5,114,437 | A | | 5/1992 | Takeuchi et al. | | |
| 5,196,353 | A | | 3/1993 | Sandhu et al. | | |
| 5,433,651 | A | | 7/1995 | Lustig et al. | | |
| 5,489,233 | A | | 2/1996 | Cook et al. | | |
| 5,527,423 | A | | 6/1996 | Neville et al. | | |
| 5,536,625 | A | * | 7/1996 | Buchanan et al. | ............. | 430/393 |
| 5,560,858 | A | * | 10/1996 | Fredj et al. | ..................... | 510/320 |
| 5,609,511 | A | | 3/1997 | Moriyama et al. | | |
| 5,643,046 | A | | 7/1997 | Katakabe et al. | | |
| 5,647,997 | A | * | 7/1997 | Holzhauer et al. | ............ | 210/721 |
| 5,658,183 | A | | 8/1997 | Sandhu et al. | | |
| 5,730,642 | A | | 3/1998 | Sandhu et al. | | |
| 5,838,447 | A | | 11/1998 | Hiyama et al. | | |
| 5,872,633 | A | | 2/1999 | Holzapfel et al. | | |
| 5,893,796 | A | | 4/1999 | Birang et al. | | |
| 5,949,927 | A | | 9/1999 | Tang | | |
| 5,958,794 | A | | 9/1999 | Bruxvoort et al. | | |
| 5,964,643 | A | | 10/1999 | Birang et al. | | |
| 6,062,968 | A | | 5/2000 | Sevilla et al. | | |
| 6,117,000 | A | | 9/2000 | Anjur et al. | | |
| 6,126,532 | A | | 10/2000 | Sevilla et al. | | |
| 6,376,381 | B1 | | 4/2002 | Sabde | | |
| 6,544,892 | B2 | | 4/2003 | Srinivasan et al. | | |
| 6,626,968 | B2 | | 9/2003 | Park et al. | | |
| 2005/0003744 | A1 | | 1/2005 | Feng et al. | | |
| 2007/0200089 | A1 | | 8/2007 | Inaba et al. | | |
| 2008/0090500 | A1 | * | 4/2008 | Hellring et al. | ................. | 451/57 |
| 2008/0242091 | A1 | | 10/2008 | Kato et al. | | |
| 2009/0221145 | A1 | | 9/2009 | Inada et al. | | |
| 2009/0246956 | A1 | | 10/2009 | Takamiya et al. | | |
| 2012/0299158 | A1 | * | 11/2012 | Shinoda et al. | ............... | 257/618 |

FOREIGN PATENT DOCUMENTS

WO    WO 2011071168 A1 *  6/2011

OTHER PUBLICATIONS

Rimpro, Surfactant, 2011, Rimpro, p. 1-3.*
Wikipedia, Surfactant, Sep. 3, 2014, Wikipedia, p. 1-13.*
Oliver et al, Chemical-Mechanical Planarization of Semiconductor Materials, 2004, Springer-Verlag, 8.1 first page, and p. 252.*
Steigerwald et al, Chemical Mechanical Planarizatio of Microelectronic Materials, 2004, Wiley-VCH, p. 36-47.*
Lee et al., "Effects of Nonionic Surfactants on Oxide-to-Polysilicon Selectivity during Chemical Mechanical Polishing," *Journal of the Electrochemical Society*, 149(8): G477-G481 (2002).

* cited by examiner

*Primary Examiner* — Binh X Tran
*Assistant Examiner* — David Cathey, Jr.
(74) *Attorney, Agent, or Firm* — Thomas E. Omholt; Derek W. Barnett; Arlene Homilla

(57) ABSTRACT

The invention provides a chemical-mechanical polishing composition containing a ceria abrasive, one or more nonionic polymers, optionally one or more phosphonic acids, optionally one or more nitrogen-containing zwitterionic compounds, optionally one or more sulfonic acid copolymers, optionally one or more anionic copolymers, optionally one or more polymers comprising quaternary amines, optionally one or more compounds that adjust the pH of the polishing compositions, water, and optionally one or more additives. The invention further provides a method of chemically-mechanically polishing a substrate with the inventive chemical-mechanical polishing composition. Typically, the substrate contains silicon oxide, silicon nitride, and/or polysilicon.

10 Claims, No Drawings

CMP COMPOSITIONS SELECTIVE FOR OXIDE AND NITRIDE WITH HIGH REMOVAL RATE AND LOW DEFECTIVITY

BACKGROUND OF THE INVENTION

Compositions and methods for planarizing or polishing the surface of a substrate are well known in the art. Polishing compositions (also known as polishing slurries) typically contain an abrasive material in a liquid carrier and are applied to a surface by contacting the surface with a polishing pad saturated with the polishing composition. Typical abrasive materials include silicon dioxide, cerium oxide, aluminum oxide, zirconium oxide, and tin oxide. U.S. Pat. No. 5,527, 423, for example, describes a method for chemically-mechanically polishing a metal layer by contacting the surface with a polishing slurry comprising high purity fine metal oxide particles in an aqueous medium. Polishing compositions are typically used in conjunction with polishing pads (e.g., a polishing cloth or disk). Suitable polishing pads are described in, for example, U.S. Pat. Nos. 6,062,968, 6,117.000, and 6,126,532, which disclose the use of sintered polyurethane polishing pads having an open-celled porous network, and U.S. Pat. No. 5,489,233, which discloses the use of solid polishing pads having a surface texture or pattern. Instead of, or in addition, being suspended in the polishing composition, the abrasive material may be incorporated into the polishing pad. U.S. Pat. No. 5,958,794 discloses a fixed abrasive polishing pad.

As a method for isolating elements of a semiconductor device, a great deal of attention is being directed towards a shallow trench isolation (STI) process where a silicon nitride layer is formed on a silicon substrate, shallow trenches are formed via etching or photolithography, and a dielectric layer (e.g., an oxide) is deposited to fill the trenches. Due to variation in the depth of trenches, or lines, formed in this manner, it is typically necessary to deposit al excess of dielectric material on top of the substrate to ensure complete filling of all trenches. The excess dielectric material is then typically removed by a chemical-mechanical planarization process to expose the silicon nitride layer. When the silicon nitride layer is exposed, the largest area of the substrate exposed to the chemical-mechanical polishing composition comprises silicon nitride, which must then be polished to achieve a highly planar and uniform surface.

Generally, past practice has been to emphasize selectivity for oxide polishing in preference to silicon nitride polishing. Thus, the silicon nitride layer has served as a stopping layer during the chemical-mechanical planarization process, as the overall polishing rate decreased upon exposure of the silicon nitride layer. For example, U.S. Pat. No. 6,544,892 and references cited therein describe polishing compositions which provide selectivity of silicon dioxide to silicon nitride. Also, U.S. Pat. No. 6,376,381 describes the use of certain nonionic surfactants to increase the polishing selectivity between silicon oxide and silicon nitride layers.

Recently, selectivity for oxide polishing in preference to polysilicon polishing has also been emphasized. For example, the addition of a series of BRIJ™ and polyethylene oxide surfactants, as well as PLURONIC™ L-64, an ethylene oxide-propylene oxide-ethylene oxide triblock copolymer with an HLB of 15, is purported to increase the polishing selectivity of oxide to polysilicon (see Lee et al., "Effects of Nonionic Surfactants on Oxide-to-Polysilicon Selectivity during Chemical Mechanical Polishing," *J. Electrochem. Soc.* 149(8): G477-G481 (2002)). Also, U.S. Pat. No. 6,626,968 purports to obtain polishing selectivity of silicon oxide to polysilicon through the use of a polymer additive having hydrophilic and hydrophobic functional groups selected from polyvinylmethylether, polyethylene glycol, polyoxyethylene 23 lauryl ether, polypropanoic acid, polyacrylic acid, and polyether glycol bis(ether).

The STI substrate is typically polished using a conventional polishing medium and an abrasive-containing polishing slurry. However, polishing STI substrates with conventional polishing media and abrasive-containing polishing slurries has been observed to result in overpolishing of the substrate surface or the formation of recesses in the STI features and other topographical defects such as microscratches on the substrate surface. This phenomenon of overpolishing and forming recesses in the STI features is referred to as dishing. Dishing is also used to refer to overpolishing and forming recesses in other types of features. Dishing is undesirable because dishing of substrate features may detrimentally affect device fabrication by causing failure of isolation of transistors and transistor components from one another, resulting in short-circuits. Additionally, overpolishing of the substrate may also result in oxide loss and exposure of the underlying oxide to damage from polishing or chemical activity, which detrimentally affects device quality and performance.

U.S. Patent Application Publications 2009/0246956, 2009/0221145, 2008/0242091, and 2007/0200089 disclose chemical-mechanical polishing compositions comprising various triazole, tetrazole, indole, and indazole compounds that purportedly provide improved dishing performance.

Despite these polishing compositions and methods, there remains a need in the art for polishing compositions and methods that can provide desirable selectivity of silicon oxide, silicon nitride, and polysilicon and that have suitable removal rates, low defectivity, and suitable dishing performance. The invention provides such a composition and method. These and other advantages of the invention, as well as additional inventive features, will be apparent from the description of the invention provided herein.

BRIEF SUMMARY OF THE INVENTION

The invention provides a chemical-mechanical polishing composition comprising, consisting essentially of, or consisting of a ceria abrasive, one or more nonionic polymers, optionally one or more phosphonic acids, optionally one or more nitrogen-containing zwitterionic compounds, optionally one or more sulfonic acid copolymers, optionally one or more anionic copolymers, optionally one or more polymers comprising quaternary amines, optionally one or more compounds that adjust the pH of the polishing composition, and water. The invention further provides a method of chemically-mechanically polishing a substrate with the inventive chemical-mechanical polishing composition. Typically, the substrate comprises silicon oxide, silicon nitride, and/or polysilicon.

The chemical-mechanical polishing composition in accordance with the invention exhibits a desirable selectivity of silicon oxide, silicon nitride, and/or polysilicon (e.g. exhibits a high removal rate on silicon oxide and a low removal rate on silicon nitride and polysilicon). In addition, the chemical-mechanical polishing composition of the invention desirably exhibits a low particle defectivity and suitable dishing performance when polishing a substrate: in accordance with a method of the invention and suitable dishing performance. Moreover, at least some embodiments of the polishing composition in accordance with the invention have a low solids content, thereby being of relatively low cost.

DETAILED DESCRIPTION OF THE INVENTION

The invention provides a chemical-mechanical polishing (CMP) composition and a method of chemically-mechanically polishing a substrate, wherein the polishing composition comprises, consists essentially of, or consists of a ceria abrasive, one or more nonionic polymers, optionally one or more phosphonic acids, optionally one or more nitrogen-containing zwitterionic compounds, optionally one or more sulfonic acid copolymers, optionally one or more anionic copolymers, optionally one or more polymers comprising quaternary amines, optionally one or more compounds that adjust the pH of the polishing composition, and water.

The chemical-mechanical polishing composition of the invention comprises a ceria abrasive. As known to one of ordinary skill in the art, ceria is an oxide of the rare earth metal cerium, and is also known as ceric oxide, cerium oxide (e.g., cerium(IV) oxide), or cerium dioxide. Cerium(IV) oxide can be formed by calcining cerium, oxalate or cerium hydroxide. Cerium also forms cerium(III) oxides such as, for example, $Ce_2O_3$ and $CeO_2$, wherein $CeO_2$ is typically the most stable phase at room temperature and under atmospheric conditions. The ceria abrasive can be any one or more of these or other oxides of ceria.

The ceria abrasive can be of any suitable form. As used herein, "wet-process" ceria refers to a ceria prepared by a precipitation, condensation-polymerization, or similar process (as opposed to, for example, fumed or pyrogenic ceria). A polishing composition of the invention comprising a wet-process ceria abrasive has been typically found to exhibit lower defects when polishing substrates according to a method of the invention. Without wishing to be bound to a particular theory, it is believed that wet-process ceria forms spherical ceria particles and/or smaller aggregate ceria particles, thereby resulting in lower substrate defectivity when used in the inventive method. An illustrative wet-process ceria is HC-60™ commercially available from Rhodia.

The ceria particles can have any suitable average size (i.e. average particle diameter). If the average ceria particle size is too small, the polishing composition may not exhibit sufficient removal rate. In contrast, if the average ceria particle size is too large, the polishing composition may exhibit undesirable polishing performance such as, for example, poor substrate defectivity. Accordingly, the ceria particles can have an average particle size of about 10 nm or more, for example, about 15 nm or more, about 20 nm or more, about 25 nm or more, or about 50 nm or more. Alternatively, or in addition, the ceria can have an average particle size of about 10,000 nm or less, for example, about 7,500 nm or less, about 5,000 nm or less, about 1,000 nm or less, about 750 nm or less, about 500 nm or less, about 250 nm or less, about 150 nm or less, about 100 nm or less, about 75 nm or less, or about 50 nm or less. Thus, the ceria can have an average particle size bounded by any two of the aforementioned endpoints. For example, the ceria can have an average particle size of about 10 nm to about 10,000 nm, about 10 nm to about 7,500 nm, about 15 nm to about 5,000 nm, about 20 nm to about 1,000 nm, about 50 nm to about 250 nm, or about 50 nm to about 150 nm. For non-spherical ceria particles, the size of the particle is the diameter of the smallest sphere that encompasses the particle. The particle size of the ceria can be measured using any suitable technique, for example, using laser diffraction techniques. Suitable particle size measurement instruments are available from e.g., Malvern Instruments (Malvern, UK).

The ceria particles preferably are colloidally stable in the inventive polishing composition. The term colloid refers to the suspension of ceria particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $\{[B]-[T]\}/[C] \leq 0.5$). More preferably, the value of $[B]-[T]/[C]$ is less than or equal to 0.3, and most preferably is less than or equal to 0.1.

The polishing composition can comprise any suitable amount of ceria abrasive. If the polishing composition of the invention comprises too little ceria abrasive, the composition may not exhibit sufficient removal rate. In contrast, if the polishing composition comprises too much ceria abrasive then the polishing composition may exhibit undesirable polishing performance and/or may not be cost effective and/or may lack stability. The polishing composition can comprise about 10 wt. % or less of ceria, for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less, about 0.9 wt. % or less, about 0.8 wt. % or less, about 0.7 wt. % or less, or about 0.6 wt. % or less of ceria. Alternatively, or in addition, the polishing composition can comprise about 0.1 wt. % or more, about 0.2 wt. % or more, about 0.3 wt. % or more, about 0.4 wt. % or more, about 0.5 wt. % or more, or about 1 wt. % or more of ceria. Thus, the polishing composition can comprise ceria in an amount bounded by any two of the aforementioned endpoints. For example, the polishing composition can comprise about 0.1 wt. % to about 10 wt. % of ceria, about 0.2 wt. % to about 9 wt. %, about 0.3 wt. % to about 8 wt. %, about 0.4 wt. % to about 7 wt. %, about 0.5 wt. % to about 6 wt. %, about 0.6 wt. % to about 5 wt. % of ceria, about 0.7 wt. % to about 4 wt. %, or about 0.8 wt. % to about 3 wt. % of ceria. In an embodiment, the polishing composition comprises, at point-of-use, about 0.2 wt. % to about 0.6 wt. % of ceria (e.g., about 0.4 wt. % of ceria). In another embodiment, the polishing composition comprises, as a concentrate, about 2.4 wt % of ceria.

The chemical-mechanical polishing composition of the invention comprises one or more nonionic polymers. In accordance with an embodiment of the invention, the polishing composition comprises one or more nonionic polymers selected from the group consisting of polyalkylene glycols, polyetheramines, polyethylene oxide/polypropylene oxide copolymers, polyacrylamide, polyvinylpyrrolidone, siloxane polyalkyleneoxide copolymers, hydrophobically modified polyacrylate copolymers, hydrophilic nonionic polymers, polysaccharides, and mixtures thereof. The nonionic polymers are preferably water-soluble and compatible with other components of the polishing composition. The nonionic polymer has been found to assist in reducing the removal rate of polysilicon. The polysilicon portion of the substrate typically is mechanically softer than silicon oxide and silicon nitride and thus experiences excessive mechanical abrasion when polished using a polishing composition suitable for substrates comprising silicon oxide and/or silicon nitride. Not wishing to be bound by any particular theory, it is believed that the nonionic polymer is adsorbed onto the polysilicon portion of the substrate, thereby forming a lubricating film that reduces the contact of the abrasive particles and other components of the polishing composition with the polysilicon surface. In some embodiments, the nonionic polymer functions as a surfactant and/or wetting agent. The presence of a nonionic polymer in the inventive polishing composition advantageously allows for useful removal rates for silicon oxide and/or silicon nitride while reducing removal rates for polysilicon.

The nonionic polymer can have any suitable molecular weight. If the molecular weight of the nonionic polymer is too low, then no advantage is obtained with the use of the nonionic polymer. Alternatively, if the molecular weight of the nonionic polymer is too high, the removal rate of the silicon oxide can be reduced to impractically low levels.

The polishing composition comprises any suitable amount of nonionic polymer at the point-of-use. The use of a large amount of nonionic polymer can lead to unwanted inhibition of the polishing rate of substrate layers other than the polysilicon and silicon nitride layers. Accordingly, the polishing composition desirably comprises about 1 ppm to about 3,000 ppm of a nonionic polymer based on the total weight of the liquid carrier and any components dissolved or suspended therein. The polishing composition can comprise about 5 ppm or more, about 50 ppm or more, about 100 ppm or more, about 150 ppm or more, about 200 ppm or more, about 250 ppm or more, about 300 ppm or more, about 400 ppm or more, about 500 ppm or more, about 750 ppm or more, about 1,000 ppm or more, or about 1,500 ppm or more or nonionic polymer. Alternatively, or in addition, the polishing composition can comprise about 2,500 ppm or less, about 2,000 ppm or less, or about 1,750 ppm or less of nonionic polymer. Thus, the polishing composition can comprise one or more nonionic polymers in an amount bounded by any two of the aforementioned endpoints. For example, the polishing composition can comprise about 1 ppm to about 2,500 ppm, about 5 ppm to about 2,000 ppm, about 50 ppm to 1,500 ppm of nonionic polymer, and the like.

In an embodiment, the nonionic polymer comprises or is a polyalkylene glycol. The polyalkylene glycol can have any suitable molecular weight. The polyalkylene glycol can have an average molecular weight of about 300 g/mol or more, for example, about 500 g/mol or more, about 1,000 g/mol or more, about 1,500 g/mol or more, about 2,000 g/mol or more, about 2.500 g/mol or more, about 3,000 g/mol or more, about 3,500 g/mol or more, about 4,000 g/mol or more, about 4,500 g/mol or more, about 5,000/mol or more, about 5,500 g/mol or more, about 6,000 g/mol or more, about 6500 g/mol or more, about 7,000 g/mol or more, or about 7,500 g/mol or more. Alternatively, or in addition, the polyalkylene glycol can have an average molecular weight of about 15,000 g/mol or less, for example, about 14,500 g/mol or less, about 14,000 g/mol or less, about 13,500 g/mol or less, about 13,000 g/mol or less, about 12,500 g/mol or less, about 12,000 g/mol or less, about 11,500 g/mol or less, about 11,000 g/mol or less, about 10,500 g/mol or less, about 10,000 g/mol or less, about 9,500 g/mol or less, about 9,000 g/mol or less, about 8,500 g/mol or less, or about 8,000 g/mol or less. Thus, the polyalkylene glycol can have an average molecular weight bounded by any two of the aforementioned endpoints. For example, the polyalkylene glycol can have an average molecular weight of about 300 g/mol to about 15,000 g/mol, about 500 g/mol to about 14,500 g/mol, about 1,000 g/mol to about 14,000 g/mol, and the like.

Illustrative polyalkylene glycols include, for example, polyethylene glycol and polypropylene glycol, including mixtures thereof. In an embodiment, the polyalkylene glycol is polyethylene glycol having an average molecular weight of about 8,000 g/mol.

In an embodiment, the nonionic polymer comprises or is a polyetheramine. Suitable polyetheramine compounds include those which are compatible with the other components of the polishing composition and which exhibit desirable polishing characteristics. Illustrative polyetheramine compounds include the JEFFAMINE™ family of amines commercially available from Huntsman Performance Products. The JEFFAMINE™ polyetheramines consist of monoamines, diamines, and triamines, which are available in a variety of molecular weights, ranging up to 5,000 g/mol. The JEFFAMINE™ polyetheramines are polyoxyalkyleneamines containing primary amino groups attached to the terminus of a polyether backbone. The polyether backbone is based either on propylene oxide (PO), ethylene oxide (EO), or mixed EO/PO (e.g., O,O'-bis(2-aminopropyl)polypropylene glycol-block-polyethylene glycol-block-polypropylene glycol). The reactivity of the polyetheramine can be modified by hindering the primary amine or through secondary amine functionality.

In some embodiments, the nonionic polymer comprises or is a polyethylene oxide/polypropylene oxide copolymer ("PEO/PPO copolymer"). The PEO/PPO copolymer, when present, desirably is compatible with the other components (e.g., ceria abrasive, nonionic polymers, phosphonic acids, and the like) of the polishing composition and exhibits desirable polishing performance. The PEO/PPO copolymer can be any suitable PEO/PPO copolymer and preferably is end-functionalized with a primary hydroxyl group or a secondary hydroxyl group. The PEO/PPO copolymer desirably has a hydrophilic-lipophilic balance (HLB) value of about 25 or less. Accordingly, the number of ethylene oxide repeating units in the PEO/PPO copolymer typically will be less than the number of propylene oxide repeating units. Preferably, the number of ethylene oxide units is less than 40 wt. %, less than 30 wt. %, less than 25 wt. %, or even less than 20 wt. % of the PEO/PPO copolymer. The PEO/PPO copolymer preferably has an HLB of about 23 or less, about 18 or less, about 12 or less, about 10 or less, about 9 or less, about 8 or less, about 7 or less, about 6 or less, or about 5 or less. Preferably, the PEO/PPO copolymer has an HLB of about 1 or more (e.g., about 1 to about 23, about 1 to about 1.8, about 1 to about 12, about 1 to about 10, about 1 to about 9, about 1 to about 8, about 1 to about 7, about 1 to about 6, or about 1 to about 5), or about 2 or more (e.g., about 2 to about 23, about 2 to about 18, about 2 to about 12, about 2 to about 10, about 2 to about 8, about 2 to about 6, or about 2 to about 5), or about 3 or more (e.g., about 3 to about 23, about 3 to about 18, about 3 to about 12, about 3 to about 9, about 3 to about 7, about 3 to about 6, or about 3 to about 5).

The PEO/PPO copolymer can have any suitable molecular weight. Desirably the PEO/PPO copolymer has a molecular weight of about 4,000 g/mol or less (e.g., about 3,500 g/mol or less, about 3,000 g/mol or less, about 2,500 g/mol or less, about 2,250 g/mol or less, about 2,000 g/mol or less, about 1,750 g/mol or less, about 1,500 g/mol or less, or even about 1,250 g/mol or less). Alternatively, or in addition, the PEO/PPO copolymer has a molecular weight of about 200 g/mol or more (e.g., about 300 g/mol or more, about 400 g/mol or more, or about 500 g/mol or more. Thus, the PEO/PPO copolymer can have a molecular weight of about 200 g/mol to about 4,000 g/mol, about 300 g/mol to about 31000 g/mol, or about 500 g/mol to about 2,500 g/mol). In different preferred embodiments, the molecular weight of the PEO/PPO copolymer is 2,500 g/mol, 1,950 g/900 g/mol, 1,850 g/mol, and 1,100 g/mol.

The polishing composition can comprise any suitable amount of a PEO/PPO copolymer at the point-of-use although using a relatively large amount of a PEO/PPO copolymer can lead to unwanted inhibition of the polishing rate of substrate layers other than the polysilicon layer. Accordingly, the polishing composition can comprise about 1 ppm to about 5,000 ppm of a PEO/PPO copolymer based on the total weight of the liquid carrier and any components dissolved or suspended therein. The polishing composition can comprise about 5 ppm or more, about 50 ppm or more, about 100 ppm or more, about 250 ppm or more, about 500 ppm or more, about 1,000 ppm or more, about 1,500 ppm or more, about 2,000 ppm or more, or about 2,500 ppm or more of a PEO/PPO copolymer. Alternatively, or in addition, the polishing composition can comprise about 4,500 ppm or less, about 4,000 ppm or less, about 3,500 ppm or less, or about 3,000 ppm or less of a PEO/PPO copolymer. Thus, the polishing composition can comprise a PEO/PPO copolymer in an amount bounded by any two of the aforementioned endpoints. For example, the polishing composition can comprise about 1 ppm to about 5,000 ppm, about 5 ppm to about 4,500 ppm, about 50 ppm to 4,000 ppm of a PEO/PPO copolymer, and the like.

In an embodiment, the polishing composition comprises, at point-of-use, about 1,000 ppm of a PEO/PPO copolymer. In another embodiment, the polishing composition comprises about 4,700 ppm of a PEO/PPO copolymer. In yet another embodiment, the polishing composition comprises about 2,700 ppm of a PEO/PPO copolymer.

The PEO/PPO copolymer can comprise or be a PLURONIC™ copolymer commercially available from BASF. The PLURONIC™ products are block copolymers based on ethylene oxide and propylene oxide Illustrative PLURONIC™ copolymers include PLURONIC™ 10R5, PLURONIC™ L31, PLURONIC™ L35, PLURONIC™ L43, and PLURONIC™ L62. In a preferred embodiment, the PEO/PPO copolymer is PLURONIC™ L31 copolymer.

In an embodiment, the nonionic polymer comprises or is polyacrylamide. Not wishing to be bound to any particular theory, it is believed that the polyacrylamide functions to stabilize the ceria abrasive particles. The polyacrylamide can have any suitable molecular weight. Desirably, the polyacrylamide has a molecular weight such that it exhibits a beneficial effect on the stability of the ceria particles. In an embodiment, the polyacrylamide has an average molecular weight of about 8,000 g/mol or higher, such as about 10,000 g/mol.

The polishing composition can comprise any suitable amount of polyacrylamide. If the amount of polyacrylamide in the polishing composition is too low, then no beneficial effect on ceria abrasive stability is obtained. In contrast, if the amount of polyacrylamide in the polishing composition is too high, the polishing composition may exhibit undesirable polishing properties and/or may not be cost effective. Accordingly, the polishing composition can comprise about 0.5 wt. % or less of polyacrylamide, for example, about 0.4 wt. % or less, about 0.3 wt. or less, about 0.2 wt. % or less, about 0.1 wt. % or less, or about 0.05 wt. % or less of polyacrylamide. Alternatively, or in addition, the polishing composition can comprise about 0.001 wt. % or more of polyacrylamide, for example, about 0.002 wt. % or more, about 0.01 wt. % or more, about 0.02 wt % or more, about 0.0375 wt. % or more, about 0.05 wt. % or more, about 0.075 wt. % or more, or about 0.1 wt. % or more of polyacrylamide. Thus, the polishing composition can comprise polyacrylamide in an amount bounded by any two of the aforementioned endpoints. For example, the polishing composition can comprise about 0.01 wt. % to about 0.5 wt. %, about 0.02 wt. % to about 0.4 wt. %, or about 0.0375 wt. % to about 0.3 wt. % of one or more polyacrylamide.

In an embodiment, the nonionic polymer comprises or is polyvinylpyrrolidone. The polyvinylpyrrolidone can have any suitable molecular weight. Desirably, the polyvinylpyrrolidone has a molecular weight such that it exhibits a beneficial effect on the stability of the ceria particles. The polyvinylpyrrolidone can have an average molecular weight of about 10,000 g/mol or higher, for example, about 15,000 g/mol or higher, about 20,000 g/mol or higher, or about 25,000 g/mol or higher. Alternatively, the polyvinylpyrrolidone can have an average molecular weight of about 40,000 g/mol or less, for example, about 35,000 g/mol or less, or about 30,000 g/mol or less. Thus, the polyvinylpyrrolidone can have an average molecular weight bounded by any two of the aforementioned endpoints. For example, the polyvinylpyrrolidone can have an average molecular weight of about 10,000 g/mol to about 40,000 g/mol and the like.

The polishing composition can comprise any suitable amount of polyvinylpyrrolidone. If the amount of polyvinylpyrrolidone in the polishing composition is too low, then no beneficial effect on ceria abrasive stability is obtained. In contrast, if the amount of polyvinylpyrrolidone in the polishing composition is too high, the polishing composition may exhibit undesirable polishing properties and/or may not be cost effective. Accordingly, the polishing composition can comprise about 0.5 wt. % or less of polyvinylpyrrolidone, for example, about 0.4 wt. % or less, about 0.3 wt. or less, about 0.2 wt. % or less, about 0.1 wt. % or less, or about 0.05 wt. % or less of polyvinylpyrrolidone. Alternatively, or in addition, the polishing composition can comprise about 0.001 wt. % or more of polyvinylpyrrolidone, for example, about 0.002 wt. % or more, about 0.01 wt. % or more, about 0.02 wt % or more, about 0.0375 wt. % or more, about 0.05 wt. % or more, about 0.075 wt. % or more, or about 0.1 wt. % or more of polyvinylpyrrolidone. Thus, the polishing composition can comprise polyvinylpyrrolidone in an a amount bounded by any two of the aforementioned endpoints. For example, the polishing composition can comprise about 0.01 wt. % to about 0.5 wt. %, about 0.02 wt % to about 0.4 wt. %, or about 0.0375 wt. % to about 0.3 wt. % of one or more polyvinylpyrrolidone.

In an embodiment, the nonionic polymer comprises or is a siloxane polyalkyleneoxide copolymer. Not wishing to be bound to any particular theory, it is believed that the siloxane polyalkyleneoxide copolymer also acts as a surfactant and/or a wetting agent. The siloxane polyalkyleneoxide copolymer can have any suitable molecular weight. Desirably, the siloxane polyalkyleneoxide copolymer has a molecular weight such that it exhibits a beneficial effect on the stability of the ceria particles. In an embodiment, the siloxane polyalkyleneoxide copolymer has an average molecular weight of about 500 g/mol or more, for example, about 750 g/mol or more, about 1,000 g/mol or more, about 1,250 g/mol or more, about 1,500 g/mol or more, about 1.750 g/mol or more, about 2,000 g/mol or more, about 2,250 g/mol or more, about 2,500 g/mol or more, about 3,000 g/mol or more, about 3,500 g/mol or more about 4,000 g/mol or more, about 4,500 g/mol or more, or about 5,000 g/mol or more. In another embodiment, the siloxane polyalkyleneoxide copolymer has a molecular weight of 20,000 g/mol or less, for example, about 19,000 g/mol or less, about 18,000 g/mol or less, about 17,000 g/mol or less, about 16,000 g/mol or less, or about 15,000 g/mol or less. Thus, the siloxane polyalkyleneoxide copolymer can have an average molecular weight bounded by any two of the aforementioned endpoints. For example, the siloxane polyalkyleneoxide copolymer can have an average molecular weight of about 500 g/mol to about 20,000 g/mol, and the like.

An illustrative siloxane polyalkyleneoxide copolymer is SILWET™ L-7604 commercially available from Momentive Performance Chemicals.

The polishing composition can comprise any suitable amount of siloxane polyalkyleneoxide copolymer. If the amount of siloxane polyalkyleneoxide copolymer in the polishing composition is too low, then no beneficial effect on ceria abrasive stability is obtained. In contrast, if the amount of siloxane polyalkyleneoxide copolymer in the polishing composition is too high, the polishing composition may exhibit undesirable polishing properties and/or may not be cost effective. Accordingly, the polishing composition can comprise about 0.5 wt. % or less of siloxane polyalkyleneoxide copolymer, for example, about 0.4 wt. % or less, about 0.3 wt. or less, about 0.2 wt. % or less, about 0.1 wt. % or less, or about 0.05 wt. % or less of siloxane polyalkyleneoxide copolymer. Alternatively, or in addition, the polishing composition can comprise about 0.001 wt. % or more of siloxane polyalkyleneoxide copolymer, for example, about 0.002 wt. % or more, about 0.01 wt. % or more, about 0.02 wt % or more, about 0.0375 wt. % or more, about 0.05 wt. % or more, about 0.075 wt. % or more, or about 0.1 wt. % or more of siloxane polyalkyleneoxide copolymer. Thus, the polishing composition can comprise siloxane polyalkyleneoxide copolymer in an amount bounded by any two of the aforementioned endpoints. For example, the polishing composition can comprise about 0.01 wt. % to about 0.5 wt. %, about 0.02 wt. % to about 0.4 wt. %, or about 0.0375 wt. % to about 0.3 wt. % of one or more siloxane polyalkyleneoxide copolymer.

Typically, the polishing composition comprises 1 ppm or more of siloxane polyalkyleneoxide copolymer. For example, the polishing composition can comprise about 5 ppm or more, about 10 ppm or more, about 25 ppm or more, about 50 ppm or more, about 75 ppm or more, about 100 ppm or more, about 125 ppm or more, about 150 ppm or more, about 200 ppm or more, about 250 or more, or about 300 ppm or more of a siloxane polyalkyleneoxide copolymer. Alternatively, or in addition, the polishing composition can comprise about 1000 ppm or less of siloxane polyalkyleneoxide copolymer, for example, about 900 ppm or less, about 800 ppm or less, about 700 ppm or less, about 600 ppm or less, about 500 ppm or less, or about 400 ppm or less of a siloxane polyalkyleneoxide copolymer. Thus, the polishing composition can comprise siloxane polyalkyleneoxide copolymer in an amount bounded by any two of the aforementioned endpoints, for example, about 1 ppm to about 1000 ppm, about 5 ppm to about 900 ppm, and the like of siloxane polyalkyleneoxide copolymer. In an embodiment, the polishing composition of the invention comprises, at point-of-use, about 150 ppm to about 600 ppm of a siloxane polyalkyleneoxide copolymer.

In an embodiment, the nonionic polymer comprises or is a hydrophobically modified polyacrylate copolymers. Illustrative hydrophobically modified polyacrylate copolymers include polymers comprising a polyacrylic acid backbone having polyethylene glycol side chains. An exemplary hydrophobically modified polyacrylate copolymer is AGRILAN™ 700 commercially available from AkzoNobel.

The polishing composition can comprise any suitable amount of a hydrophobically modified polyacrylate copolymer. If the amount of hydrophobically modified polyacrylate copolymer is too low, then no beneficial effect is observed. In contrast, if the amount of hydrophobically modified polyacrylate copolymer is too high, the polishing composition may exhibit undesirable polishing properties and/or may not be cost effective. Typically, the polishing comprises about 2,000 ppm or less of a hydrophobically modified polyacrylate copolymer, for example, about 1,750 ppm or less, about 1,500 ppm or less, or about 1,250 ppm or less of a hydrophobically modified polyacrylate copolymer. Alternatively, or in addition, the polishing composition can comprise about 500 ppm or more of one or more hydrophobically modified polyacrylate copolymer, for example, about 750 ppm or more, or about 1,000 ppm or more of a hydrophobically modified polyacrylate copolymer. Thus, the polishing composition can comprise a hydrophobically modified polyacrylate copolymer in an amount bounded by any two of the aforementioned endpoints, for example, about 500 ppm to about 2,000 ppm, or about 750 ppm to about 1,750 ppm, and the like. In an embodiment the polishing composition comprises about 1,000 ppm of one or more hydrophobically modified polyacrylate copolymers.

In an embodiment, the nonionic polymer comprises or is a hydrophilic nonionic polymer. Illustrative hydrophilic nonionic polymers include poly(2-ethyl-2-oxazoline). The polishing composition can comprise any suitable amount of a hydrophilic nonionic polymer. If the amount of hydrophilic nonionic polymer is too low, then no beneficial effect is observed. In contrast, if the amount of hydrophilic nonionic polymer is too high, the polishing composition may exhibit undesirable polishing properties and/or may not be cost effective.

Typically, the polishing comprises about 1,000 ppm or less of a hydrophilic nonionic polymers, for example, about 900 ppm or less, about 800 ppm or less, about 700 ppm or less, or about 600 ppm or less of a hydrophilic nonionic polymer. Alternatively, or in addition, the polishing composition can comprise about 50 ppm or more of one or more hydrophilic nonionic polymers, for example, about 100 ppm or more, about 150 ppm or more, about 200 ppm or more, about 250 ppm or more, about 300 ppm or more, about 350 ppm or more, about 400 ppm or more, about 450 ppm or more, or about 500 ppm or more of a hydrophilic nonionic polymer. In an embodiment the polishing composition comprises about 250 ppm of one or more a hydrophilic nonionic polymer. Thus, the polishing composition can comprise a hydrophilic nonionic polymer in an amount bounded by any two of the aforementioned endpoints, for example, about 50 ppm to about 1,000 ppm, or about 100 ppm to about 900 ppm, and the like.

Typically, the hydrophilic nonionic polymer has a molecular weight of about 50,000 g/mol.

In an embodiment, the nonionic polymer comprises or is a polysaccharide. Illustrative polysaccharides include, for example, hydroxyalkylcelluloses, dextran, carboxymethyl dextran, sulfonated dextran, chitosan, xanthan gum, carboxymethylcellulose, carrageenan, and mixtures thereof.

The polishing composition comprises a suitable amount of polysaccharide. Typically, the polishing composition comprises about 1,000 ppm or less of polysaccharide at the point-of-use. For example, the polishing composition can comprise, e.g., about 900 ppm or less of polysaccharide, about 800 ppm or less, about 700 ppm or less, about 600 ppm or less, about 500 ppm or less, about 400 ppm or less, about 300 ppm or less, about 200 ppm or less, or about 100 ppm or less of polysaccharide at the point-of-use.

Non-limiting examples of hydroxyalkylcelluloses include modified cellulose ethers, for example, methylhydroxyethyl cellulose (HEMC), methylhydroxypropyl cellulose (HPMC), hydroxyethyl cellulose (HEC), and hydroxypropyl cellulose (HPC).

In a preferred embodiment, the polysaccharide is hydroxyethylcellulose, for example, CELLOSIZE™ QP-09L hydroxyethylcellulose commercially available from Dow Chemical Company. The hydroxyethylcellulose has a suitable viscosity. Typically, the hydroxyethylcellulose has a viscosity of about 50 centipoise or more when measured as a 5% solution in water at 25° C. For example, the hydroxyethylcellulose can have a viscosity of about 75 cP or more or about 100 cP or more. Alternatively, or in addition, the hydroxyethylcellulose can have a viscosity of about 150 cP or less, for example, about 125 cP or less. Thus, the hydroxyethylcellulose can have a viscosity bounded by any two of the aforementioned endpoints, for example, about 50 cP to about 150 cP, about 75 cP to about 125 cP, and the like. The viscosity can be measured using any suitable method known by one of ordinary skill.

The polishing composition of the invention can comprise more than one nonionic polymer. For example, in some embodiments, the polishing composition comprises a siloxane polyalkyleneoxide copolymer and polyvinylpyrrolidone. Alternatively, or in addition, the polishing composition can comprise a polysaccharide and a polyethyleneoxide/polypropylene oxide copolymer.

In some embodiments, the chemical-mechanical polishing composition of the invention comprises one or more phosphonic acids. Not wishing to be bound to any particular theory, it is believed that a phosphonic acid acts as a metal chelator in the polishing composition and helps to reduce residue accumulation on the substrate surface and polishing tools. Illustrative phosphonic acids include the DEQUEST™ phosphonates available commercially from Dequest, including DEQUEST™ P9030, DEQUEST™ 2000EG, and DEQUEST™ 2010.

In a preferred embodiment, the phosphonic acid is selected from the group consisting of 1-hydroxyethylidene-1,1-diphosphonic acid, aminotri(methylene)phosphonic acid, aminotri(methylene)phosphonic acid, methylphosphonic acid, diethylenetriaminepentakis(methylphosphonic acid), hexamethylenediamine-N,N,N',N''-tetrakis(methylphosphonic acid), iminodi(methylphosphonic acid), (aminomethyl) phosphonic acid, N-(phosphonomethyl)glycine, and mixtures thereof.

The polishing composition can comprise any suitable amount of phosphonic acids. If the amount of phosphonic acids is too low, no beneficial effect is observed. In contrast, if the amount of phosphonic acids is too high, the removal rate of silicon oxides can be reduced. Accordingly, the polishing composition typically comprises about 0.001 wt. % or more, for example, about 0.002 wt. %, about 0.003 wt. %, about 0.014 wt. %, about 0.005 wt. %, about 0.0075 wt. %, about 0.01 wt. %, about 0.05 wt. %, about 0.1 wt. % or more, about 0.2 wt. % or more, or about 0.5 wt. % or more of phosphonic acids. Alternatively, or in addition, the polishing composition can contain about 2 wt. % or less, for example, about 1.5 wt. % or less, or about 1 wt. % or less of phosphonic acids. Thus, the polishing composition can comprise an amount of phosphonic acids bounded by any two of the aforementioned endpoints. For example, the polishing composition can comprise about 0.001 wt. % to about 2 wt. %, 0.002 wt. % to about 1.5 wt. %, or about 0.003 wt. % to about 1 wt. % of phosphonic acids.

In another embodiment, the polishing composition comprises about 1,000 ppm or less of phosphonic acids, e.g., about 900 ppm or less, about 800 ppm or less, about 700 ppm or less, about 600 ppm or less, about 500 ppm or less, about 400 ppm or less, about 300 ppm or less, about 200 ppm or less, or about 100 ppm or less of phosphonic acids. In different embodiments, the polishing composition comprises about 150 ppm of a phosphonic acid, about 125 ppm of a phosphonic acid, about 50 ppm of a phosphonic acid, and about 25 ppm of a phosphonic acid.

In some embodiments, the chemical-mechanical polishing composition of the invention comprises one or more nitrogen-containing zwitterionic compounds. The nitrogen-containing compounds that can be zwitterionic compounds are nitrogen-containing compounds that can be zwitterionic compounds at a particular pH. Zwitterionic compounds are neutral compounds having formal opposite charges on non-adjacent atoms. Zwitterionic compounds typically contain both an acid moiety and a base moiety, with the pKa of the acid moiety differing from the pKa of the base moiety, such that the compound is zwitterionic when the pH is between the pKa of the acid moiety and the pKa of the base moiety. Zwitterionic compounds also are referred to as inner salts. For example, amino acids (e.g., lysine) are nitrogen-containing compounds that can be zwitterionic compounds, though the nitrogen-containing compounds that can be zwitterionic compounds need not be amino acids. For example, betaine, pyridineethanesulfonic acids, pyridine sulfonic acids, pyridyl acetic acids, 3-(3-pyridyl)propionic acid, pyrazine carboxylic acid, 1-(3-sulfopropyl)pyridinium hydroxide, and picolinic acid are nitrogen-containing compounds that can be zwitterionic compounds. Additional nitrogen-containing compounds that can be zwitterionic compounds, which are useful in the polishing composition of the invention, include sulfanilic acid, dodecyldimethyl(3-sulfopropyl)ammonium hydroxide (lauryl sulfobetaine), (carboxymethyl)trimethylammonium hydroxide (betaine), 2-(N-morpholino)ethanesulfonic acid, N-2-acetamidoiminodiacetic acid, 1,3-bis[tris (hydroxymethyl)methylamino]propane, N-2-acetamido-2-aminoethanesulfonic acid, 3-(N-morpholine) propanesulfonic acid, N-tris(hydroxymethyl)methyl-2-aminoethanesulfonic acid, N-2-hydroxyethylpiperazine-N-2-ethanesulfonic acid, N-2-hydroxyethylpiperazine-N'-3-propanesulfonic acid, N-tris(hydroxymethyl)methylglycine, cyclohexylaminoethanesulfonic acid, 3-(cyclohexylamino) propanesulfonic acid 2-acrylamido-2-methylpropanesulfonic acid, salts thereof, and mixtures thereof. The polishing composition comprises a suitable amount of one or more nitrogen-containing zwitterionic compounds, when present. If the amount of nitrogen-containing zwitterionic compound is too low, then no beneficial effect is observed. In contrast, if the amount of the nitrogen-containing zwitterionic compound is too high, the polishing composition may exhibit undesirable polishing properties and/or may not be cost effective. The polishing composition can comprise, at the point-of-use, about 1 ppm or more of a nitrogen-containing zwitterionic compound, for example, about 5 ppm or more, about 10 ppm or more, about 15 ppm or more, about 25 ppm or more, about 50 ppm or more, about 75 ppm or more, about 100 ppm or more, about 125 ppm or more, about 150 ppm or more, about 175 ppm or more, about 200 ppm or more, about 250 ppm or more, about 300 ppm or more, about 350 ppm or more, about 400 ppm or more, about 450 ppm or more, or about 500 ppm or more of a nitrogen-containing zwitterionic compound. Alternatively, or in addition, the polishing composition can comprise about 1,000 ppm or less of a nitrogen-containing zwitterionic compound, for example, about 950 ppm or less, about 900 ppm or less, about 850 ppm or less, about 800 ppm or less, about 750 ppm or less, about 700 ppm or less, about 650 ppm or less, about 600 ppm or less, or about 550 ppm or less of a nitrogen-containing zwitterionic compound. Thus, the polishing composition can comprise one or more nitrogen-containing zwitterionic compounds in an amount bounded by any two of the aforementioned endpoints, for example, about 1 ppm to about 1000 ppm, about 5 ppm to about 950 ppm, and the like.

In a preferred embodiment, the polishing composition comprises picolinic acid. The polishing composition typically comprises about 100 ppm or less of picolinic acid at the point-of-use, for example, about 90 ppm or less, about 85 ppm or less, about 80 ppm or less, about 75 ppm or less, about 70 ppm or less, about 65 ppm or less, about 60 ppm or less about 55 ppm or less of picolinic acid at the point-of-use. Alternatively, or in addition, the polishing composition can comprise about 15 ppm or more of picolinic acid, for example, about 20 ppm or more, about 25 ppm or more, about 30 ppm or more, about 35 ppm or more, about 40 ppm or more, about 45 ppm or more, or about 50 ppm or more of picolinic acid at the point-of-use. Thus, the polishing composition can comprise picolinic acid in an amount bounded by any two of the aforementioned endpoints. For example, the polishing composition can comprise about 15 ppm to about 100 ppm of picolinic acid at the point-of-use, about 20 ppm to about 95 ppm, about 25 ppm to about 90 ppm, about 30 ppm to about 85 ppm of picolinic acid, and the like.

In another preferred embodiment, the polishing composition comprises betaine. The polishing composition typically comprises about 1000 ppm or less of betaine at the point-of-use, for example, about 950 ppm or less, about 900 ppm or less, about 850 ppm or less, about 800 ppm or less, about 750 ppm or less, about 700 ppm or less, about 650 ppm or less, about 600 ppm or less about 550 ppm or less of betaine at the point-of-use. Alternatively, or in addition, the polishing composition can comprise about 100 ppm or more of betaine at the point-of-use, for example, about 150 ppm or more, about 200 ppm or more, about 250 ppm or more, about 300 ppm or more, about 350 ppm or more, about 400 ppm or more, about 450 ppm or more, or about 500 ppm or more of betaine at the point-of-use. Thus, the polishing composition can comprise betaine in an amount bounded by any two of the aforementioned endpoints. For example, the polishing composition can comprise about 100 ppm to about 1000 ppm of betaine at the point-of-use, about 150 ppm to about 950 ppm, about 200 ppm to about 900 ppm, about 250 ppm to about 850 ppm, about 300 ppm to about 800 ppm of betaine, and the like.

In some embodiments, the polishing composition of the invention comprises more than one nitrogen-containing zwitterionic compounds. For example, in some embodiments the polishing composition comprises picolinic acid and betaine, and/or an amino acid (e.g., lysine).

In some embodiments, the chemical-mechanical polishing composition comprises one or more sulfonic acid copolymers. An illustrative sulfonic acid copolymer is copolymer of acrylic acid and 2-acrylamido-2-methylpropyl sulfonic acid (AMPS). In an embodiment, the sulfonic acid copolymer is poly(acrylic acid)-co-poly-(AMPS) having an average molecular weight of about 15,000 g/mol or more, for example, about 25,000 g/mol or more, about 50,000 g/mol or more, about 75,000 g/mol or more, about 100,000 g/mol or more, about 125,000 g/mol or more, about 150,000 g/mol or more, about 200,000 g/mol or more, about 225,000 g/mol or more, or about 250,000 g/mol or more. Alternatively, or in addition, the poly(acrylic acid)-co-poly-(AMPS) copolymer has an average molecular weight of about 500,000 g/mol or less, about 450,000 g/mol or less, about 400,000 g/mol or less, about 350,000 g/mol or less, or about 300,000 g/mol or less. Thus, the poly(acrylic acid)-co-poly-(AMPS) copolymer can have a molecular weight bounded by any two of the aforementioned endpoints, for example, about 15,000 g/mol to about 500,000 g/mol, and the like.

Sulfonic acid copolymers may also include sulfonated multipolymers such as terpolymers. Illustrative examples of sulfonated multipolymers include ALCOFLOW™ 270 from AkzoNobel (Chicago, Ill.) and CARBOSPERSE™ K-797D from Lubrizol (Cleveland, Ohio).

The polishing composition can comprise any suitable amount of the poly(acrylic acid)-co-poly-(AMPS) copolymer, when present, at the point-of-use. If the amount of the poly(acrylic acid)-co-poly-(AMPS) copolymer is too low, then no beneficial effect on substrate topography is obtained. In contrast, if the amount of the poly(acrylic acid)-co-poly-(AMPS) copolymer is too high, the polishing composition may exhibit undesirable polishing properties and/or may not be cost effective. Accordingly, the polishing composition can comprise at the point-of-use about 1 ppm or more of the poly(acrylic acid)-co-poly-(AMPS) copolymer based on the total weight of the liquid carrier and any components dissolved or suspended therein. For example, the polishing composition can comprise about 5 ppm or more, about 50 ppm or more, about 100 ppm or more, about 250 ppm or more, about 500 ppm or more, about 1,000 ppm or more, or about 1,250 ppm or more of a poly(acrylic acid)-co-poly-(AMPS) copolymer. Alternatively, or in addition, the polishing composition can comprise about 2,000 ppm or less of a poly(acrylic acid)-co-poly-(AMPS) copolymer, for example, about 1,750 ppm or less, or about 1,500 ppm or less of the poly(acrylic acid)-co-poly-(AMPS) copolymer. Thus, the polishing composition can comprise the poly(acrylic acid)-co-poly-(AMPS) copolymer in an amount bounded by any two of the aforementioned endpoints, for example, about 1 ppm to about 2,000 ppm, about 5 ppm to about 1,500 ppm, about 50 ppm to about 1,250 ppm of the poly(acrylic acid)-co-poly-(AMPS) copolymer, and the like.

The chemical-mechanical polishing composition of the invention can comprise one or more anionic copolymers. Any suitable anionic copolymer may be used. The anionic copolymer can comprise copolymer with anionic monomers. Examples of anionic monomers include 2-acylamido-2-methylpropane sulfonic acid, 4-styrenesulfonic acid, vinyl sulfonic acid, and vinyl phosphonic acid. The anionic monomers can be polymerized with any suitable organic acid. Examples of suitable organic acids include acrylic acid, methacrylic acid and maleic acid. Any combination of these anionic monomers with organic acids may be considered suitable anionic polymers. An illustrative anionic copolymer is poly (maleic acid)-co-poly(styrene-4-sulfonic acid) (VERSA TL™-4 commercially available from Akzo Nobel).

The chemical-mechanical polishing composition of the invention can comprise polymers comprising quaternary amities. The polymers comprising quaternary amines, when present, can be any suitable polymers comprising quaternary amines and can be present in the polishing composition in any suitable amount. Examples of suitable monomers include methacrylamido propyl trimethyl ammonium chloride, dimethylamino(meth)acrylate and diallyldimethylammonium chloride.

The chemical-mechanical polishing composition of the invention can comprise one or more compounds capable of adjusting (i.e., that adjust) the pH of the polishing composition (i.e., pH adjusting compounds). The pH of the polishing composition can be adjusted using any suitable compound capable of adjusting the pH of the polishing composition. The pH adjusting compound desirably is water-soluble and compatible with the other components of the polishing composition. Typically, the chemical-mechanical polishing composition has a pH of about 5.5 to about 8.5 at the point-of-use. In some embodiments, it is desirable that the compound capable of adjusting the pH is capable of buffering an acidic pH of the polishing composition. Accordingly, in these embodiments, it is desirable that the pH of the polishing composition is less than 7.0 (e.g., 6.5+/−0.5, 6.0+/−0.5, 5.5+/−0.5, 5.0+/−0.5, 4.5+/−0.5, 4.0+/−0.5, 3.5+/−0.5, 3.0+−0.5, 2.5+/−0.5, or 2.0+/−0.5). Typically, the pH of the polishing composition in these embodiments is about 5.5 at the point-of-use. Thus, the compound capable of adjusting the pH of the polishing cm position typically has at least one ionizable group having a pKa of about 5 to about 7 when measured at 25° C.

In other embodiments, it is desirable that the compound capable of adjusting the pH is capable of buffering a basic pH. Accordingly, in these embodiments, it is desirable that the pH of the polishing composition is greater than 7.0 (e.g., 7.3+/−0.2, 7.5+/−0.3, 7.8+/−0.5, 8.0+/−0.5, 8.3+/−0.5, 8.5+/−0.5, 8.8+/−0.5, or 9.0+/−0.5). Typically, the pH of the polishing composition in these embodiments is about 7 to about 9 at the point-of-use.

In an embodiment, the compound capable of adjusting the pH is selected from the group consisting of ammonium salts, alkali metal salts, carboxylic acids, alkali metal hydroxides, alkali metal carbonates, alkali metal bicarbonates, borates, and mixtures thereof.

The chemical-mechanical polishing composition of the invention optionally further comprises one or more additives. Illustrative additives include conditioners, acids (e.g., sulfonic acids), complexing agents (e.g., anionic polymeric complexing agents), chelating agents, biocides, scale inhibitors, dispersants, etc.

A biocide, when present, can be any suitable biocide and can be present in the polishing composition in any suitable amount. A suitable biocide is an isothiazolinone biocide. The amount of biocide used in the polishing composition typically is about 1 to about 50 ppm, preferably about 10 to about 20 ppm.

It will be understood that any of the components of the polishing composition that are acids, bases, or salts (e.g., organic carboxylic acid, base, and/or alkali metal carbonate, etc.), when dissolved in the water of the polishing composition, can exist in dissociated form as cations and anions. The amounts of such compounds present in the polishing composition as recited herein will be understood to refer to the weight of the undissociated compound used in the preparation of the polishing composition.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., ceria abrasive, nonionic polymer, phosphonic acid, nitrogen-containing zwitterionic compound, optionally polyethylene oxide/polypropylene oxide copolymer, optionally one or more sulfonic acid copolymers, optionally one or more compounds capable of adjusting the pH of the polishing composition, and/or any optional additive) as well as any combination of ingredients (e.g., ceria abrasives, polyethylene oxide/polypropylene oxide copolymer, etc.).

For example, the polishing composition can be prepared by (i) providing all or a portion of the liquid carrier, (ii) dispersing the ceria abrasive, one or more nonionic polymer polymers, optionally one or more phosphonic acids, optionally one or more nitrogen-containing zwitterionic compounds, optionally one or more sulfonic acid copolymers, and optionally one or more compounds capable of adjusting the pH of the polishing composition, using any suitable means for preparing such a dispersion, (iii) adjusting the pH of the dispersion as appropriate, and (iv) optionally adding suitable amounts of any other optional components and/or additives to the mixture.

Alternatively, the polishing composition can be prepared by (i) providing one or more components (e.g., liquid carrier, a ceria abrasive and one or more nonionic polymers, optionally one or more nitrogen-containing zwitterionic compounds, and one or more optional components) in a ceria oxide slurry (ii) providing one or more components in an additive solution (e.g., liquid carrier, one or more polyethylene oxide/polypropylene oxide copolymers, optionally one or more phosphonic acids, and one or more optional components), (iii) adjusting the pH of the dispersion as appropriate, and (iv) optionally adding suitable amounts of any other optional additives to the mixture.

The polishing composition can be supplied as a one-package system comprising a ceria abrasive, one or more nonionic polymers, optionally one or more phosphonic acids, optionally one or more nitrogen-containing zwitterionic compounds, optionally one or more sulfonic acid copolymers, optionally one or more compounds capable of adjusting the pH of the polishing composition, and water. Alternatively, two-container, or three or more container, combinations of the components of the polishing composition are within the knowledge of one of ordinary skill in the art. Optional components, such as, for example, a biocide, can be placed in the first and/or second containers or a third container, as appropriate. Furthermore, the components in the first or second container can be in dry form while the components in another container, if present, can be in the form of an aqueous dispersion. Moreover, the components in the first or second containers can have different, substantially similar, or even equal pH values. If an optional component and/or additive such as an anionic polymeric complexing agent is a solid, it may be supplied either in dry form or as a mixture in the liquid carrier.

Alternatively, the polishing composition of the invention is supplied as a two-package system comprising a ceria oxide slurry and an additive solution, wherein the ceria oxide slurry consists essentially of, or consists of, a ceria abrasive, one or more nonionic polymers, optionally one or more nitrogen-containing zwitterionic compounds, optionally one or more sulfonic acid copolymers, optionally one or more compounds capable of adjusting the pH of the polishing composition and water, and wherein the additive solution consists essentially of, or consists of, optionally one or more phosphoric acids, optionally one or more compounds capable of adjusting the pH of the polishing composition, optionally one or more nonionic polymers, and optionally one or more sulfonic acid copolymers. The two-package system allows for the adjustment of substrate global flattening characteristics and polishing speed by changing the blending ratio of the two packages, i.e., the ceria oxide slurry and the additive solution.

Various methods can be employed to utilize such a two-package polishing system. For example, the cerium oxide slurry and additive solution can be delivered by different pipes that are joined and connected at the outlet of supply piping to supply the mixture on the polishing table, or the cerium oxide slurry and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). If the polishing composition is to be produced using point-of-use mixing, the components of the polishing composition are separately stored in two or more storage devices, as appropriate. By the term "flow line" is meant a path of flow from an individual storage container to the point-of-use of the component stored therein. The one or more flow lines can each lead directly to the point-of-use, or, in the situation that more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if they are combined about 5 minutes or less prior to being added in mixed form onto the platen, for example, about 4 minutes or less, about 3 minutes or less, about 2 minutes or less, about 1 minute or less, about 45 s or less, about 30 s or less, about 10 s or less, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the ceria abrasive, nonionic polymer(s), optionally phosphoric acid(s), optionally one or more nitrogen-containing zwitterionic compounds, optionally polyethyleneoxide-polypropylene oxide copolymer(s), optionally sulfonic acid copolymer(s), optionally compound(s) capable of adjusting the pH of the polishing composition, and optionally additive (s) can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the ceria abrasive, non-ionic polymer(s), optionally phosphonic acid(s), optionally one or more nitrogen-containing zwitterionic compounds, optionally polyethyleneoxide/polypropylene oxide copolymer(s), optionally sulfonic acid copolymer(s), optionally compound(s) capable of adjusting the pH of the polishing composition, and optionally additive(s) are at least partially or fully dissolved in the concentrate.

The polishing composition of the invention desirably exhibits a high removal rate when polishing a substrate comprising silicon oxide according to a method of the invention. For example, when polishing silicon wafers comprising high density plasma (HDP) oxides and/or plasma-enhanced tetraethyl ortho silicate (PETEOS) and/or tetraethyl orthosilicate (TEOS) in accordance with an embodiment of the invention, the polishing composition desirably exhibits a silicon oxide removal rate of about 500 Å/min or higher, 700 Å/min or higher, about 1.000 Å/min or higher, about 1.250 Å/rain or higher, about 1,500 Å/min or higher, about 1,750 Å/min or higher, about 2,000 Å/min or higher, about 2,500 Å/min or higher, about 3,000 Å/min or higher, about 3,500 Å/min or higher. In an embodiment removal rate for silicon oxide can be about 4,000 Å/min or higher, about 4,500 Å/min or higher, or about 5,000 Å/min or higher.

In addition, the chemical-mechanical polishing composition of the invention desirably exhibits a low removal rate when polishing a substrate comprising silicon nitride according to a method of the invention. For example, when polishing silicon wafers comprising silicon nitride in accordance with an embodiment of the invention, the polishing composition desirably exhibits a removal rate of the silicon nitride of about 250 Å/min or lower, for example, about 200 Å/min or lower, about 150 Å/min or lower, about 100 Å/min or lower, about 75 Å/min or lower, about 50 Å/min or lower, or even about 25 Å/min or lower.

In addition, the chemical-mechanical polishing composition of the invention desirably exhibits a low removal rate when polishing a substrate comprising polysilicon according to a method of the invention. For example, when polishing silicon wafers comprising polysilicon in accordance with an embodiment of the invention, the polishing composition desirably exhibits a removal rate of polysilicon of about 1,000 Å/min or lower, about 750 Å/min or lower, about 500 Å/min or lower, about 250 Å/min or lower, about 100 Å/min or lower, about 50 Å/min or lower, about 25 Å/min or lower, about 10 Å/min or lower, or even about 5 Å/min or lower.

Moreover, the polishing composition of the invention desirably exhibits low particle defects when polishing a substrate, as determined by suitable techniques. In a preferred embodiment, the chemical-mechanical polishing composition of the invention desirably comprises a wet-process ceria which contributes to the low defectivity. Particle defects on a substrate polished with the inventive polishing composition can be determined by any suitable technique. For example, laser light scattering techniques, such as dark field normal beam composite (DCN) and dark field oblique beam composite (DCO), can be used to determine particle defects on polished substrates. Suitable instrumentation for evaluating particle defectivity is available from, for example, KLA-Tencor (e.g. SURFSCAN™ SP1 instruments operating at a 120 nm threshold or at 160 nm threshold).

A substrate, especially silicon comprising silicon oxide and/or silicon nitride and/or polysilicon, polished with the inventive polishing composition desirably has a DCN value of about 20,000 counts or less, e.g., about 17,500 counts or less, about 15,000 counts or less, about 12,500 counts or less, about 3,500 counts or less, about 3,000 counts or less, about 2,500 counts or less, about 2,000 counts or less, about 1,500 counts or less, or about 1,000 counts or less. Preferably substrates polished in accordance with an embodiment of the invention has a DCN value of about 750 counts or less, about 500 counts, about 250 counts, about 125 counts, or even about 100 counts or less. Alternatively, or in addition the chemical-mechanical polishing composition of the invention desirably exhibits low scratches when polishing a substrate, as determined by suitable techniques. For example, silicon wafers polished in accordance with an embodiment of the invention desirably comprise about 250 scratches or less, or about 125 scratches or less, as determined by any suitable method known in the art.

The polishing composition of the invention can be tailored to provide effective polishing at the desired polishing ranges selective to specific thin layer materials, while at the same time minimizing surface imperfections, defects, corrosion, erosion and the removal of stop layers. The selectivity can be controlled, to some extent, by altering the relative concentrations of the components of the polishing composition. When desirable, the method of the invention can be used to polish a substrate with a silicon dioxide to polysilicon polishing selectivity of about 5:1 or higher (e.g., about 10:1 or higher, about 15:1 or higher, about 25:1 or higher, about 50:1 or higher, about 100:1 or higher, or about 150:1 or even higher). Also, the method of the invention can be used to polish a substrate with a silicon nitride to polysilicon polishing selectivity of about 2:1 or higher (e.g., about 4:1 or higher, or about 6:1 or higher). Certain formulations can exhibit even higher silicon dioxide to polysilicon selectivities, such as about 20:1 or higher, or even about 30:1 or higher. In a preferred embodiment, the method of the invention simultaneously provides selective polishing of silicon dioxide and silicon nitride relative to polysilicon.

The invention also provides a method of chemically-mechanically polishing a substrate comprising (i) contacting a substrate with a polishing pad and the chemical-mechanical polishing composition as described herein, (ii) moving the polishing pad relative to the substrate with the chemical-mechanical polishing composition therebetween, and (iii) abrading at least a portion of the substrate to polish the substrate.

The chemical-mechanical polishing composition can be used to polish any suitable substrate and is especially useful for polishing substrates comprising at least one layer (typically a surface layer) comprised of a low dielectric material. Suitable substrates include wafers used in the semiconductor industry. The wafers typically comprise or consist of, for example, a metal, metal oxide, metal nitride, metal composite, metal alloy, a low dielectric material, or combinations thereof. The method of the invention is particularly useful for polishing substrates comprising silicon oxide, silicon nitride, and/or polysilicon, e.g., any one, two, or especially all three of the aforementioned materials. For example, the polishing composition can be used to polish silicon wafers used in the electronics industry. In this regard, the silicon can be undoped silicon, or it can be p-type silicon doped with boron or aluminum. In addition, the silicon can be polysilicon.

The substrate desirably comprises polysilicon in combination with silicon oxide and/or silicon nitride. The polysilicon can be any suitable polysilicon, many of which are known in the art. The polysilicon can have any suitable phase, and can be amorphous, crystalline, or a combination thereof. The silicon oxide similarly can be any suitable silicon oxide, many of which are known in the art. Suitable types of silicon oxide include but are not limited to borophosphosilicate glass (BPSG), PETEOS, thermal oxide, undoped silicate glass, and HDP oxide. Other suitable metal oxides include partially-stabilized zirconia (PSZ).

Advantageously, silicon substrates polished using the inventive polishing method exhibit low surface roughness and low particle defectivity. Surface roughness ($R_a$) which is defined herein as the arithmetical mean of deviations from planarity, can be measured using any suitable technique. Suitable techniques include stylus profilometry and optical profilometry, using instruments available from, e.g., Veeco Instruments (Plain view, NY), as well as atomic force microscopy. Typically, the inventive polishing method produces a surface roughness on silicon wafers of about 20 Å or less (e.g., about 14 Å or less, or about 12 Å or less, or about 10 Å or less, or even about 8 Å or less), when measured using an optical profilometer.

The polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof and mixtures thereof. Soft polyurethane polishing pads are particularly useful in conjunction with the inventive polishing method. Typical pads include but are not limited to SURFIN™ 000, SURFIN™ SSW1, SPM3100

(commercially available from, for example, Eminess Technologies), POLITEX™, and Fujibo POLYPAS™ 27. A particularly preferred polishing pad is the EPIC™ D100 pad commercially available from Cabot Microelectronics.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a substrate being polished enables the determination of the polishing endpoint, i.e., the determination of when to terminate the polishing process with respect to a particular substrate.

EXAMPLES

These following examples further illustrate the invention but, of course, should not be construed as in any way limiting its scope.

The following abbreviations are used throughout the Examples removal rate (RR); tetraethyl orthosilicate (TEOS); silicon nitride (SiN); polysilicon (polySi); molecular weight (MW); hydroxyethylcellulose (HEC); phosphonic acid (PA); polyethylene glycol (PEG); plasma enhanced tetraethyl orthosilicate (PETEOS); polyvinylpyrrolidone (PVP) polyethyleneoxide/polypropylene oxide copolymer (PEO/PPO); poly(acrylic-acid)-co-poly(2-acrylamido-2-methylpropyl sulfonic acid (PAA-AMPS), and siloxane polyalkeneoxide copolymer (SiO/PAO).

In the following examples, substrates were polished using either a MIRRA™ (Applied Materials, Inc.) or a REFFLEXION™ (Applied Materials, Inc.) tool. An IC 101™ polishing pad (Rohm and Haas Electronic Materials) was used with identical polishing parameters for all compositions. Removal rates were calculated by measuring the film thickness, using spectroscopic elipsometry, and subtracting the final thickness from the initial thickness.

Example 1

This example demonstrates that polishing compositions of the invention, which comprise a ceria abrasive, one or more polyethylene oxide/polypropylene oxide copolymers, one or more nonionic polymers, one or more phosphonic acids, optionally one or more nitrogen-containing zwitterionic compounds, and water, can exhibit good overall substrate polishing properties, including a suitable removal rate of TEOS with good polySi selectivity.

Silicon wafers comprising TEOS and polySi were polished under identical conditions with Polishing Compositions 1A-1M as identified in Table 1. Each of the polishing compositions contained 0.4 wt. % wet-process ceria (HC-60™ commercially available from Rhodia). Each of the polishing compositions contained PEG (8,000 MW commercially available from Dow Corporation), polyethylene oxide/polypropylene oxide copolymer (PLURONIC™ L31), phosphonic acid (DEQUEST™ D2000EG), as indicated in Table 1. Polishing Compositions 1I-1M further contained 128 ppm of picolinic acid. The pH of each polishing compositions was 5.5. The control composition contained only 0.4 wt. % wet-process ceria and water.

The TEOS and polySi removal rates were determined for each polishing composition and are set forth in Table 1.

TABLE 1

| Comp. | PEG (ppm) | PEO/PPO (ppm) | PA (ppm) | N-containing zwitterionic cpd (ppm) | TEOS RR (Å/min) | polySi RR (Å/min) |
|---|---|---|---|---|---|---|
| 1A | 842 | 2668 | 23 | none | 3121 | 31 |
| 1B | 842 | 2668 | 58 | none | 2515 | 16 |
| 1C | 842 | 2668 | 117 | none | 1738 | 13 |
| 1D | 1667 | 1000 | 22 | none | 4060 | 51 |
| 1E | 1667 | 1000 | 44 | none | 2598 | 22 |
| 1F | 1667 | 1000 | 64 | none | 2052 | 2 |
| 1G | 1667 | 1000 | 88 | none | 1879 | 21 |
| 1H | 1667 | 1000 | 130 | none | 1534 | 22 |
| 1I | 1667 | 1000 | 22 | picolinic acid (128) | 3441 | 55 |
| 1J | 1667 | 1000 | 44 | picolinic acid (128) | 2383 | 24 |
| 1K | 1667 | 1000 | 64 | picolinic acid (128) | 1706 | 23 |
| 1L | 1667 | 1000 | 88 | picolinic acid (128) | 1449 | 22 |
| 1M | 1667 | 1000 | 130 | picolinic acid (128) | 1157 | 17 |
| control | none | none | none | none | 4800 | 420 |

As is apparent by the results set forth in Table 1, polishing compositions containing a wet-process ceria abrasive, polyethylene glycol, a polyethylene oxide/polypropylene oxide copolymer, a phosphonic acid, optionally a nitrogen-containing zwitterionic compound, and water exhibit good overall substrate polishing properties, including TEOS removal rate higher than 1000 Å/min, and as high as 4,000 Å/min., with high polySi removal rates less than about 50 Å/min, thereby having high TEOS:polySi selectivity.

Example 2

This example demonstrates that polishing compositions of the invention, which comprise a ceria abrasive, one or more nonionic polymers, one or more phosphonic acids, picolinic acid, and water, can exhibit good overall substrate polishing properties, including a suitable removal rate of TEOS with good polySi selectivity.

Silicon wafers comprising TEOS and polySi were polished under identical conditions with 5 different polishing compositions identified as Polishing Compositions 2A-2E, as identified in Table 2. Each of the polishing compositions contained 0.4 wt. % of HC-60™ wet-process ceria commercially available from Rhodia; the siloxane polyalkyleneoxide copolymer (SiO/PAO) was SILWET™ L-7604 manufactured by Momentive Performance Chemicals; the PVP was from Sigma-Aldrich; the phosphonic acid source was DEQUEST™ D2000EG; and the picolinic acid was from Yuki Gosei Kogyo USA, Inc. Polishing Composition 2A did not a siloxane polyalkyleneoxide copolymer, but did contain 1667 ppm PEG (8,000 MW commercially available from Dow Corporation).

The TEOS, SiN, and polySi removal rates were determined for each polishing composition and are set forth in Table 3.

TABLE 2

| Composition | SiO/PAO (ppm) | PVP (ppm) | PA (ppm) | Picolinic Acid (ppm) |
|---|---|---|---|---|
| 2A | 0 | 0 | 64 | 15 |
| 2B | 90 | 90 | 64 | 40 |
| 2C | 360 | 90 | 64 | 40 |
| 2D | 90 | 0 | 64 | 40 |
| 2E | 600 | 0 | 64 | 40 |

TABLE 3

| Composition | TEOS RR (Å/min) | SiN RR (Å/min) | polySi 60s RR (Å/min) | polySi 180s RR (Å/min) |
|---|---|---|---|---|
| 2A | 1706 | 257 | 33 | 54 |
| 2B | 2113 | 65 | 54 | 98 |
| 2C | 2029 | 66 | 43 | 84 |
| 2D | 2058 | 88 | 33 | 63 |
| 2E | 2128 | 119 | 40 | 88 |

The dishing performance of the polishing compositions was evaluated on patterned wafers by measuring thickness across a profile. The results of the dishing performance are set forth in Table 4.

TABLE 4

| Composition | Trench Thickness 50% 500 μm (Å) |
|---|---|
| 2A | 4119 |
| 2B | 4479 |
| 2C | 4565 |
| 2D | 4576 |
| 2E | 4447 |

As is apparent by the results set forth in Table 3, polishing compositions containing wet-process ceria abrasive, a siloxane polyalkylene copolymer, one or more phosphonic acids, picolinic acid, and water (Polishing Compositions 2B-2E) can exhibit good overall substrate polishing properties, including a suitable removal rate of TEOS with good TEOS:SiN and TEOS:polySi selectivity. In addition, as is apparent from the results set forth in Table 4, such polishing compositions (Polishing Composition 2B-2E) exhibit suitable dishing performance, as evidenced by an increase in remaining trench thickness (as compared to Polishing Composition 2A of about 300-400 Å.

Example 3

This example demonstrates that polishing compositions of the invention, which comprise a ceria abrasive, one or more nonionic polymers, one or more phosphonic acids, one or more nitrogen-containing zwitterionic compounds, one or more sulfonic acid copolymers, and water, can exhibit good overall substrate polishing properties, including a suitable removal rate of TEOS with good polySi and SiN selectivity.

Silicon wafers comprising TEOS, polySi, and SiN were polished under identical conditions with 4 different polishing compositions identified as Polishing Compositions 3A-3D. Each polishing composition contained, at point-of-use, 0.4 wt. % of HC-60™ wet-process ceria commercially available from Rhodia. The polishing compositions also contained poly (acrylic acid)-co-poly(AMPS) (PAA/AMPS) from Shandong TaiHe Water Treatment Co., Ltd., phosphonic acid (PA) in the form of DEQUEST™ D2000EG, and picolinic acid from Yuki Gosei Kogyo USA, Inc. in the amounts indicated in Table 5. Polishing Composition 3A contained 1667 ppm of PEG (8,000 MW) and did not contain either HEC, or a sulfonic acid copolymer. Polishing Compositions 3B-3D contained different amounts of CELLOSIZE™ QP-09L hydroxyethylcellulose (HEC) commercially available from Dow Chemical Company, as indicated in Table 5. The pH of each of the polishing compositions was 7-8.

The TEOS, SiN, and polySi removal rates were determined for each polishing composition and are set forth in Table 6. In addition, the polishing properties of Polishing Compositions 3A, 3C, and 3D were determined on patterned wafers, and these results are set forth in Table 7.

TABLE 5

| Composition | PAA/AMPS (ppm) | PA (ppm) | Picolinic Acid (ppm) | PEG (ppm) | HEC (ppm) |
|---|---|---|---|---|---|
| 3A | 0 | 64 | 16 | 1667 | 0 |
| 3B | 1000 | 0 | 16 | 1667 | 100 |
| 3C | 1000 | 0 | 16 | 1667 | 500 |
| 3D | 1000 | 0 | 16 | 1667 | 1000 |

TABLE 6

| Composition | TEOS RR (Å/min) | SiN RR (Å/min) | polySi 60s RR (Å/min) | polySi 180s RR (Å/min) |
|---|---|---|---|---|
| 3A | 1843 | 27 | 2 | 29 |
| 3B | 908 | 160 | 29 | 29 |
| 3C | 945 | 143 | 18 | 6 |
| 3D | 874 | 133 | 5 | 30 |

TABLE 7

| Composition | Trench Thickness 50% 500 μm (Å) |
|---|---|
| 3A | 1398 |
| 3C | 2084 |
| 3D | 2206 |

As is apparent from the results set forth in Tables 6 and 7, polishing compositions containing a ceria abrasive, one or more nonionic polymers, one or more phosphonic acids, one or more nitrogen-containing zwitterionic compounds, and water (Polishing Compositions 3A-3D), exhibit good overall substrate polishing properties, including a suitable removal rate of TEOS with good TEOS:SiN and TEOS:polySi selectivity, as well as suitable dishing performance. For example, Polishing Compositions 38-3D, each containing NEC as a nonionic polymer, exhibit suitable TEOS:polySi selectivity. Moreover, each of Polishing Compositions 3C and 3D showed low trench loss across the range of feature sizes (e.g., trench thickness of 2100-2500 Å).

Example 4

This example demonstrates that polishing compositions of the invention, which comprise a ceria abrasive, one or more nonionic polymers, one or more phosphonic acids, one or more nitrogen-containing zwitterionic compounds, and water, can exhibit good overall substrate polishing properties, including a suitable removal rate of TEOS with good polySi and SiN selectivity.

Silicon wafers comprising TEOS, polySi, and SiN were polished under identical conditions with 2 different polishing compositions identified as Polishing Compositions 4A and 48 using a REFLEXION™ tool commercially available from Applied Materials. Each of polishing Compositions 4A and 4B contained 0.4 wt. % of HC-60™ wet-process ceria commercially available from Rhodia, 1000 ppm polyethylene oxide/polypropylene oxide copolymer (PLURONIC™ L31), 64 ppm phosphonic acid (PA), 16 ppm picolinic acid, and 1667 polyethylene glycol. While Polishing Composition 4A contained no betaine, Polishing Composition 4B contained 100 ppm betaine. The pH of each of the polishing compositions was 7-8.

The TEOS, SiN, and polySi removal rates were determined for each polishing composition and are set forth in Table 8.

TABLE 8

| Composition | Betaine (ppm) | TEOS RR (Å/min) | SiN RR (Å/min) | polySi RR (Å/min) |
| --- | --- | --- | --- | --- |
| 4A | 0 | 1024 | 16 | 3 |
| 4B | 100 | 954 | 11 | 3 |

As is apparent by the results set forth in Table 8, polishing compositions containing a ceria abrasive, one or more nonionic polymers, one or more phosphonic acids, one or more nitrogen-containing zwitterionic compounds, and water exhibit good overall substrate polishing properties, including a suitable removal rate of TEOS with good TEOS:SiN and TEOS:polySi selectivity. Moreover, such polishing compositions containing betaine (Polishing Composition 4B) exhibit higher TEOS removal rates and good TEOS:SiN and TEOS:polySi selectivity.

Example 5

This example demonstrates that polishing compositions of the invention, which comprise a ceria abrasive, one or more nonionic polymers, one or more nitrogen-containing zwitterionic compounds, optionally one or more sulfonic acid copolymers, optionally one or more anionic polymers, and water, can exhibit good overall substrate polishing properties, including a suitable removal rate of TEOS with good polySi and SiN selectivity.

Silicon wafers comprising TEOS, polySi, and SiN were polished under identical conditions with Polishing Compositions 5A-5H, as identified in Table 9. Each of Polishing Compositions 5A-5H contained 0.4 wt. % of HC-60™ wet-process ceria commercially available from Rhodia, 50 ppm of PEG (8,000 MW) commercially available from Dow Corporation, and 500 ppm picolinic acid. The hydrophobically modified polyacrylate copolymer (herein designated as comb polymers) used in this example consisted of a poly(acrylic acid) backbone with PEG side chains (AGRILAN™ 700 manufactured by Akzo Nobel). The anionic co-polymer was poly(maleic acid)-co-poly(styrene-4-sulfonic acid) (VERSA™ TL-4, manufactured by Akzo Nobel).

The TEOS, SiN, and polySi removal rates were determined for each polishing composition, and the results are set forth in Table 10. The dishing performance of each polishing composition was determined, and the results are set forth in Table 11.

TABLE 9

| Composition | HEC (ppm) | PEO/PPO (ppm) | AA-AMPS (ppm) | Lysine (ppm) | Versa TL4 (ppm) | Comb Polymer (ppm) | Betaine (ppm) |
| --- | --- | --- | --- | --- | --- | --- | --- |
| 5A | 0 | 0 | 0 | 0 | 0 | 0 | 0 |
| 5B | 1500 | 0 | 1500 | 0 | 0 | 0 | 0 |
| 5C | 500 | 1000 | 500 | 0 | 0 | 0 | 0 |
| 5D | 1500 | 1000 | 1500 | 0 | 0 | 0 | 0 |
| 5E | 0 | 0 | 1000 | 1000 | 0 | 0 | 0 |
| 5F | 0 | 0 | 0 | 0 | 0 | 0 | 500 |
| 5G | 0 | 0 | 0 | 0 | 250 | 0 | 500 |
| 5H | 0 | 0 | 0 | 0 | 0 | 1000 | 0 |

TABLE 10

| Composition | TEOS RR (Å/min) | SiN RR (Å/min) | polySi RR (Å/min) |
| --- | --- | --- | --- |
| 5A | 4763 | 25 | 80 |
| 5B | 1445 | 83 | 14 |
| 5C | 924 | 114 | 20 |
| 5D | 1294 | 92 | 8 |
| 5E | 1031 | 44 | 18 |
| 5F | 1234 | 45 | 15 |
| 5G | 824 | 41 | 15 |
| 5H | 1058 | 41 | 964 |

TABLE 11

| Composition | Poly Loss (Å) | POP-Dishing (Å) | SiN Loss (Å) | STI Dishing (Å) |
| --- | --- | --- | --- | --- |
| 5A | NA | NA | 345 | 974 |
| 5B | NA | NA | 39 | 637 |
| 5C | NA | NA | 70 | 694 |
| 5D | NA | NA | 39 | 655 |
| 5E | 0 | 5 | 77 | 425 |
| 5F | 1 | 3 | 77 | 352 |
| 5G | 9 | 2 | 53 | 325 |
| 5H | 0 | 4 | 57 | 166 |

As is apparent by the results set forth in Tables 10 and 11, polishing compositions comprising a ceria abrasive, one or more nonionic polymers, one or more nitrogen-containing zwitterionic compounds, optionally one or more sulfonic acid copolymers, optionally one or more anionic polymers, and water exhibit good SiN loss performance and suitable dishing performance.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemical-mechanical polishing of a substrate comprising:
   (i) contacting a substrate comprising silicon oxide and polysilicon with a polishing pad and a chemical-mechanical polishing composition consisting essentially of
      (a) a ceria abrasive,
      (b) one or more nonionic polymers selected from the group consisting of polyalkylene glycols, polyetheramines, polyethylene oxide/polypropylene oxide copolymers, polyacrylamide, polyvinylpyrrolidone, siloxane polyalkyleneoxide copolymers, hydrophobically modified polyacrylate copolymers, hydrophilic nonionic polymers, polysaccharides, and mixtures thereof,
      (c) picolinic acid,
      (d) optionally one or more phosphonic acids,
      (e) optionally one or more sulfonic acid copolymers,
      (f) one or more anionic copolymers,
      (g) optionally one or more polymers comprising quaternary amines,
      (h) optionally one or more compounds that adjust the pH of the polishing composition, and
      (i) water;
   (ii) moving the polishing pad relative to the substrate with the chemical-mechanical polishing composition therebetween; and
   (iii) abrading at least a portion of the substrate to remove silicon oxide and polysilicon therefrom and to polish the substrate.

2. The method of claim 1, wherein the removal of silicon oxide from the substrate is at a rate greater than the removal of polysilicon from the substrate.

3. The method of claim 1, wherein the substrate further comprises silicon nitride, and the abrading of at least a portion of the substrate removes silicon nitride therefrom.

4. The method of claim 3, wherein the removal of silicon oxide from the substrate is at a rate greater than the removal of silicon nitride from the substrate.

5. The method of claim 1, wherein picolinic acid is present at the point-of-use in an amount of from about 1 ppm to about 1000 ppm.

6. The method of claim 1, wherein one or more phosphonic acids are present in the chemical-mechanical polishing composition.

7. The method of claim 1, wherein one or more sulfonic acid copolymers are present in the chemical-mechanical polishing composition.

8. The method of claim 1, wherein one or more polymers comprising quaternary amines are present in the chemical-mechanical polishing composition.

9. The method of claim 1, wherein one or more compounds that adjust the pH the polishing composition are present in the chemical-mechanical polishing composition.

10. The method of claim 1, wherein one or more phosphonic acids, one or more sulfonic acid copolymers, one or more anionic copolymers, one or more polymers comprising quaternary amines, and one or more compounds that adjust the pH the polishing composition are present in the chemical-mechanical polishing composition.

* * * * *